(12) United States Patent
McLeod et al.

(10) Patent No.: US 6,830,600 B2
(45) Date of Patent: Dec. 14, 2004

(54) COLD TRAPS FOR VAPOR LUBRICATION PROCESSES

(75) Inventors: Paul Stephen McLeod, Berkeley, CA (US); Michael Joseph Stirniman, Fremont, CA (US); Jing Gui, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 412 days.

(21) Appl. No.: 09/833,748

(22) Filed: Apr. 12, 2001

(65) Prior Publication Data

US 2002/0006467 A1 Jan. 17, 2002

Related U.S. Application Data

(60) Provisional application No. 60/197,230, filed on Apr. 14, 2000.

(51) Int. Cl.[7] .................................................. B01D 8/00
(52) U.S. Cl. ................................ 55/385.2; 55/DIG. 15; 96/420; 62/55.5
(58) Field of Search ..................... 55/385.2, DIG. 15; 96/420; 95/14, 17; 62/55.5

(56) References Cited

U.S. PATENT DOCUMENTS

| | | | |
|---|---|---|---|
| 4,780,354 A | 10/1988 | Nakayama et al. | 428/141 |
| 4,782,798 A | 11/1988 | Jones | 123/90.11 |
| 4,880,687 A | 11/1989 | Yokoyama et al. | 428/141 |
| 4,889,767 A | 12/1989 | Yokoyama et al. | 428/336 |
| 5,030,260 A | 7/1991 | Beck et al. | 55/316 |
| 5,069,967 A | 12/1991 | Yokoyama et al. | 428/336 |
| 5,080,971 A | 1/1992 | Yokoyama et al. | 428/336 |
| 5,161,233 A | 11/1992 | Matsuo et al. | 355/218 |
| 5,229,899 A | 7/1993 | Brown et al. | 360/97.02 |
| 5,232,503 A | 8/1993 | Lewis | 118/421 |
| 5,303,558 A * | 4/1994 | Caton et al. | 62/55.5 |
| 5,331,487 A | 7/1994 | Gregory et al. | 360/97.02 |
| 5,427,867 A | 6/1995 | Kogure et al. | 428/611 |
| 5,536,577 A | 7/1996 | Murayama et al. | 428/408 |
| 5,559,650 A | 9/1996 | Repphun et al. | 360/97.02 |
| 5,638,103 A | 6/1997 | Obata et al. | 347/164 |
| 5,716,911 A | 2/1998 | Furey et al. | 508/110 |
| 5,739,980 A | 4/1998 | Brooks | 360/99.08 |
| 5,827,424 A | 10/1998 | Gillis et al. | 210/180 |
| 5,830,577 A | 11/1998 | Murayama et al. | 428/411.1 |
| 5,837,339 A | 11/1998 | Wood et al. | 428/36.6 |
| 5,871,521 A | 2/1999 | Kaneda et al. | 607/89 |
| 5,871,621 A | 2/1999 | Ross | 204/192.2 |
| 5,920,443 A | 7/1999 | Eckhoff | 360/99.08 |
| 6,158,226 A * | 12/2000 | Noji et al. | 62/55.5 |
| 6,241,793 B1 * | 6/2001 | Lee et al. | 55/434.2 |
| 2002/0096113 A1 * | 7/2002 | Nguyen | 118/715 |

* cited by examiner

Primary Examiner—Robert A. Hopkins
(74) Attorney, Agent, or Firm—Raghunath S. Minisandram; Jesus Del Castillo

(57) ABSTRACT

A method for preventing migration of lubrication molecules into adjacent process chambers while coating a thin layer of lubricant over a storage surface of a disc using a vapor lubrication process. The method includes trapping the lubrication molecules that are not deposited onto the storage surface of the discs during the vapor lubrication process by using one or more cold traps including cold trapping surfaces in a vapor lubrication station.

7 Claims, 4 Drawing Sheets

COLD TRAPS FOR VAPOR LUBRICATION PROCESSES

RELATED APPLICATION

This application claims the benefit of U.S. Provisional Application Ser. No. 60/197,230 filed Apr. 14, 2000 under 35 U.S.C. 119(e).

FIELD OF THE INVENTION

The present invention relates to the field of mass storage devices. More particularly, this invention relates to a method and apparatus for depositing a lubrication layer on a storage disc using a vapor deposition technique.

BACKGROUND OF THE INVENTION

One key component of any computer system is a device to store data. Computer systems have many different places where data can be stored. One common place for storing massive amounts of data in a computer system is on a disc drive. The most basic parts of a disc drive are an information storage disc that is rotated, an actuator that moves a transducer to various locations over the disc, and electrical circuitry that is used to write and read data to and from the disc. The disc drive also includes circuitry for encoding data so that it can be successfully retrieved and written to the disc surface. A microprocessor controls most of the operations of the disc drive as well as passing the data back to the requesting computer and taking data from a requesting computer for storing to the disc.

The transducer is typically placed on a small ceramic block, also referred to as a slider, that is aerodynamically designed so that it flies over the disc. The slider is passed over the disc in a transducing relationship with the disc. Most sliders have an air-bearing surface (ABS) which includes rails and a cavity between the rails. When the disc rotates (generally, at rotational speeds of 10,000 RPM or higher), air is dragged between the rails and the disc surface causing pressure, which forces the head away from the disc. At the same time, the air rushing past the cavity or depression in the air-bearing surface produces a negative pressure area. The negative pressure or suction counteracts the pressure produced at the rails. The slider is also attached to a load spring, which produces a force on the slider directed toward the disc surface. The various forces on the slider equilibrate, so that the slider flies over the surface of the disc at a particular desired fly height. The fly height is the distance between the disc surface and the transducing head, which is typically the thickness of the air lubrication film. This film eliminates the friction and resulting wear that could occur if the transducing head and disc were in mechanical contact during disc rotation. The layer of lubricant substantially prevents loss of magnetic material (and the data stored therein) and minimizes friction between the head and the disc. In some disc drives, the slider passes through a layer of lubricant rather than flying over the surface of the disc. For recording and reading reliability, it is essential that the thickness of the layer of lubricant be very small so as to not to increase substantially the distance between the head and the magnetic material. It is also essential that the thickness of the coating of the lubricant be very uniform.

In the disc drive industry, high-performance, thin-film storage discs produced by depositing successive layers on a substrate apparatus for preparation of such storage discs are well known in the art. For storage discs of the type formed on a rigid disc substrate, each layer in the storage disc is deposited in a separate chamber. For example, the underlayer, the magnetic layer, and the over-layer (lubrication layer) are generally deposited in separate processing chambers. The lubrication layer can be deposited using a sequential dip coating or a vapor deposition technique (vapor lubrication process).

Application of the lubricant layer to the disc surface is generally the final step in the manufacturing of storage discs, after the discs have been coated with magnetic material. Generally, the magnetic material is deposited onto the disc surface using a sputtering process. The main or common transport chamber including the process chambers are all generally held under low working pressure, e.g., typically around $5 \times 10^{-5}$ to $5 \times 10^{-9}$ Torr, by means of high performance vacuum pumps. Generally, the process chambers are positioned along the main chamber and receive substrates for sequential processing.

The method and apparatus for the vapor lubrication process includes evaporating lubrication molecules continuously in a vapor lubrication station held under vacuum using a specially designed evaporator, and emitting evaporated lubrication molecules through special diffuser plates to control vapor emission onto the discs to provide a uniform thickness of lubricant on the disc surface. One problem with the vapor lubricating apparatus is cross-contamination of the lubrication molecules that are not deposited on the disc surface that can migrate either by vapor transport or surface migration into adjacent process chambers, such as sputtering chambers and hence can contaminate the adjacent process chambers. For example, after deposition of a carbon overcoat onto a disc substrate using sputtering and removal of the substrate from the carbon-overcoat processing chamber for transfer to a vapor lubrication processing chamber downstream, lubrication molecules that are not deposited on the disc surface in the vapor lubrication station can migrate into the sputtering chamber. The same type of cross-contamination can occur when transferring the disc from the vapor lubrication process to other downstream or upstream processes. Cross-contamination of lubrication molecules is generally undesirable, since it can affect the properties of the medium. Another problem encountered with such cross-contamination is buildup of lubrication molecules within the adjacent process chambers such as the sputtering chamber. This lubrication molecule buildup must be removed from these chambers. Removal of the lubrication molecule necessitates a shutdown of the apparatus, reducing productivity.

What is needed is an improvement to the current method and apparatus of vapor lubrication process that can significantly reduce cross-contamination of lubrication molecules in the upstream and downstream process chambers.

SUMMARY OF THE INVENTION

A method for preventing migration of lubrication molecules into adjacent process chambers while coating a thin layer of lubricant over a storage surface of a disc using a vapor lubrication process. Further, the method reduces cross-contamination in upstream and/or downstream process chambers during transfer of the storage discs between the upstream, downstream, and vapor lubrication process chambers. The method includes trapping the lubrication molecules that are not deposited onto the storage surface of the discs during the vapor lubrication process in a vapor lubrication station by using one or more cold traps including cold trapping surfaces. The method can further include sensing the temperature of the cold trapping surfaces and shutting down the vapor lubrication station to prevent accidental migration of lubrication molecules into the adjacent process chambers due to a failure in the operation of the cold traps.

Also discussed is a vapor lubrication station that includes one or more cold traps to prevent migration of lubrication molecules that are not deposited onto storage discs during a vapor lubrication process in the vapor lubrication station into adjacent process chambers. Further, the cold traps include cold trapping surfaces to trap and prevent migration of lubrication molecules into transport chambers used in transporting the storage discs between the process chambers. Also, the station includes one or more temperature sensors to sense the temperature of the cold trapping surfaces and to output a signal proportional to the temperature. Further, the station includes control circuitry coupled to the temperature sensors to automatically shut-off the operation of the vapor lubrication station to prevent accidental migration of lubrication molecules in case of a failure in the operation of the cold traps.

Advantageously, the method and apparatus described above provides cold traps that can significantly reduce cross-contamination in upstream and downstream process chambers and/or during transfer of the storage discs between downstream, upstream, and vapor lubrication process chambers.

DESCRIPTION OF THE PREFERRED EMBODIMENT

In the following detailed description of the preferred embodiments, reference is made to the accompanying drawings, which form a part hereof, and in which are shown by way of illustration specific embodiments in which the invention may be practiced. It is to be understood that other embodiments may be utilized and structural changes may be made without departing from the scope of the present invention.

The invention described in this application is useful with all mechanical configurations of disc drives having either rotary or linear actuation. In addition, the invention is also useful in all types of disc drives including hard disc drives, zip drives, floppy disc drives and any other type of drives where unloading the transducer from a surface and parking the transducer may be desirable.

Figure 1:
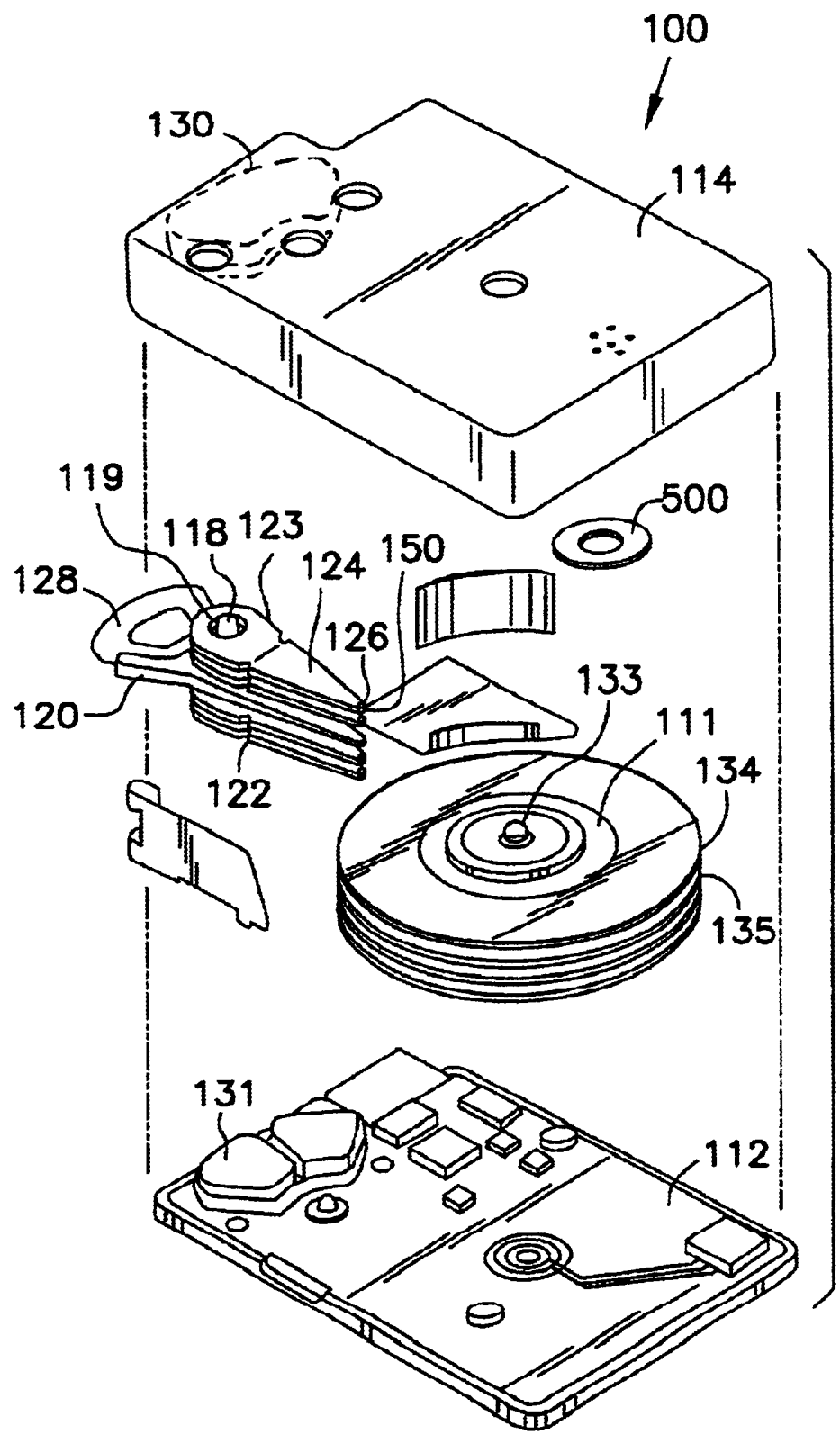
FIG. 1 is an exploded view of a disc drive with a multiple disc stack.

FIG. 1 is an exploded view of one type of a disc drive 100 having a rotary actuator. The disc drive 100 includes a housing or a base 112, and a cover 114. The base 112 and cover 114 form a disc enclosure. An inertia ring 500 is attached to the cover 114. Rotatably attached to the base 112 on an actuator shaft 118 is an actuator assembly 120. The actuator assembly 120 includes a comb-like structure 122 having a plurality of actuator arms 123. Attached to the separate arms 123 on the comb 122, are load beams or load springs 124. Load beams or load springs are also referred to as suspensions. Attached at the end of each load spring 124 is a slider 126, which carries a magnetic transducer 150. The slider 126 with the transducer 150 form what is often called the head. The head with the load spring 124 is often called the head gimbal assembly. It should be noted that many sliders have one transducer 150 and that is what is shown in the figures. It should also be noted that this invention is equally applicable to sliders having more than one transducer, such as what is referred to as an MR or magneto resistive head in which one transducer 150 is generally used for reading and another is generally used for writing. On the end of the actuator arm assembly 120 opposite the load springs 124 and the sliders 126 is a voice coil 128.

Attached within the base 112 is a first magnet 130 and a second magnet 131. As shown in FIG. 1, the first magnet 130 is associated with the cover 114 and the second magnet 131 is associated with the base 112. The first and second magnets 130, 131, and the voice coil 128 are the key components of a voice coil motor, which applies a force to the actuator assembly 120 to rotate it about the actuator shaft 118 and the bearing cartridge 119. Also mounted to the base 112 is a spindle motor. The spindle motor includes a rotating portion called the spindle hub 133. In this particular disc drive, the spindle motor is within the hub. In FIG. 1, a number of discs 134 are attached to the spindle hub 133. Each of the discs 134 has a recording surface 135. Only one disc 134 is numbered for the sake of clarity. In other disc drives a single disc or a different number of discs may be attached to the hub. The invention described herein is equally applicable to disc drives which have a plurality of discs as well as disc drives that have a single disc. The invention described herein is also equally applicable to disc drives with spindle motors, which are within the hub 133 or under the hub.

Figure 2:
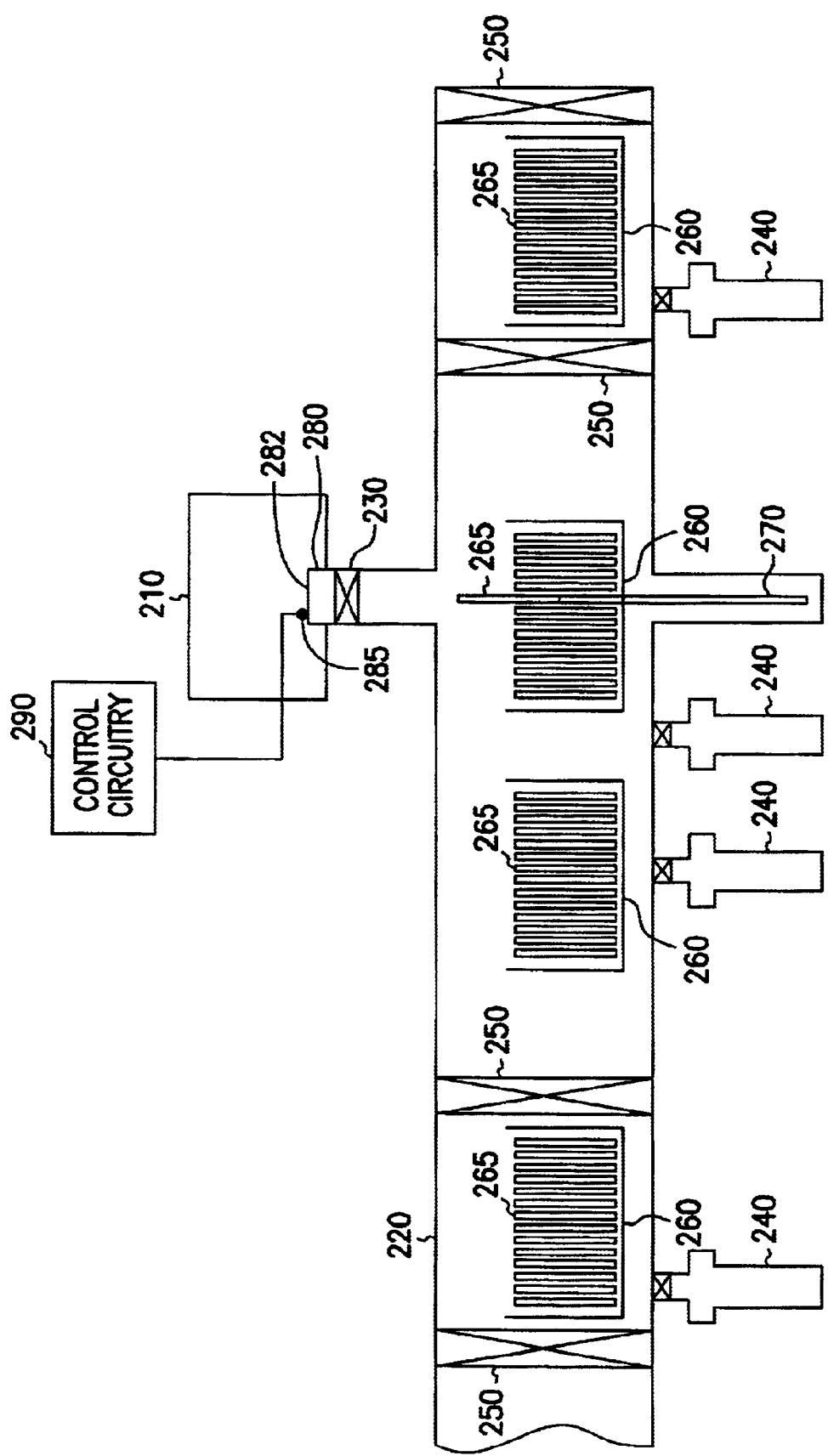
FIG. 2 illustrates one example embodiment of major components of a vapor lubrication station and its interconnections to adjacent process chambers according to the present invention.

FIG. 2 illustrates one example embodiment of a vapor lubrication station including major components and its interconnections to adjacent process chambers according to the present invention. Shown in FIG. 2 are the vapor lube station 210 and a vacuum tunnel 220. Vapor lube station 210 deposits a thin uniform lubrication layer over a disc surface using a vapor deposition technique also referred to as a vapor lubrication process. The vapor lubrication process includes evaporating lubrication molecules continuously in the vapor lubrication station held under vacuum using a specially designed evaporator, and emitting evaporated lubrication molecules through special diffuser plates to control vapor emission onto the discs to provide a uniform thickness of lubricant onto the disc surface.

The vacuum tunnel 220, as shown in FIG. 2, is coupled to the vapor lube station 210 through an entry/exit port 230. The vacuum tunnel 220 serves as a main or common transport chamber interconnecting various upstream and downstream process chambers to receive the discs for a sequential processing. The vacuum tunnel 220 is generally held under low working pressure, e.g., typically around $5 \times 10^{-5}$ to $5 \times 10^{-9}$ Torr, by means of high performance vacuum pumps 240 as shown in FIG. 2.

Also shown in FIG. 2 are multiple entry/exit ports 250 disposed in the vacuum tunnel 220 to aid in the sequential processing of the storage discs. The entry/exit ports can be gates and/or valves that open to receive the discs and close after outputting the discs. Further, FIG. 2 shows conveying devices such as cassettes 260 disposed at various locations in the vacuum tunnel 220 to aid in the sequential/batch processing of the discs. The cassettes are shown carrying the discs 265. In addition, FIG. 2 shows a lifter 270 disposed in the vacuum tunnel 220 near the vapor lubrication station 210 to aid in loading the discs 265 into the vapor lubrication station 210 for coating the discs 265, and to unload discs from the vapor lubrication station 210 after completion of the coating of the discs through the entry/exit port 230.

One or more cold traps 280 are disposed around the entry/exit port 230 to prevent migration of lubrication molecules that are not deposited onto the storage discs during the vapor lubrication process in the vapor lubrication station 210 into adjacent process chambers through the vacuum tunnel 220. In some embodiments, the adjacent process chambers can include adjacent process chambers used in depositing successive layers on the discs. Adjacent process chambers can also include transport chambers used in transporting the storage discs between the process chambers. In some embodiments, additional cold traps 280 are disposed in the vacuum tunnel 220 around the entry/exit ports 250 to prevent migration of the lubrication molecules to the adjacent process chambers during transfer of the storage discs from upstream processes to the vapor lubrication station 210 and/or during transfer of the storage discs 265 from the vapor lubrication station 210 to downstream processes.

The transporting of storage discs 265 is accomplished using various disc handling systems such as transport mechanisms, conveyers, lifters, and/or one or more cassettes 260 as shown in FIG. 2.

In some embodiments, the cold traps 280 include cold trapping surfaces 282 to prevent migration of lubrication molecules that are not deposited onto the disc into the adjacent process chambers. The temperature of the cold trapping surfaces 282 to trap the lubrication molecules is held around −195° C. to 25° C. during operation. The cold trapping surfaces 282 are cooled using refrigerants such as liquid nitrogen, low-temperature refrigerant, cold water, cold air, and/or any other cooling medium suitable for cooling the cold trapping surfaces 282. In some embodiments, the cold traps 280 include one or more temperature sensors 285 to sense the temperature of the cold trapping surfaces 282 and to output a signal proportional to a sensed temperature. In this embodiment, the sensors 285 are coupled to a control circuitry 290 to monitor the sensed temperature of the cold trapping surfaces 282 by receiving the signal from the sensors 285 and to automatically shut-off the operation of the vapor lube station to prevent accidental migration of the lubrication molecules due to a failure in the operation of the cold traps 280.

Figure 3:
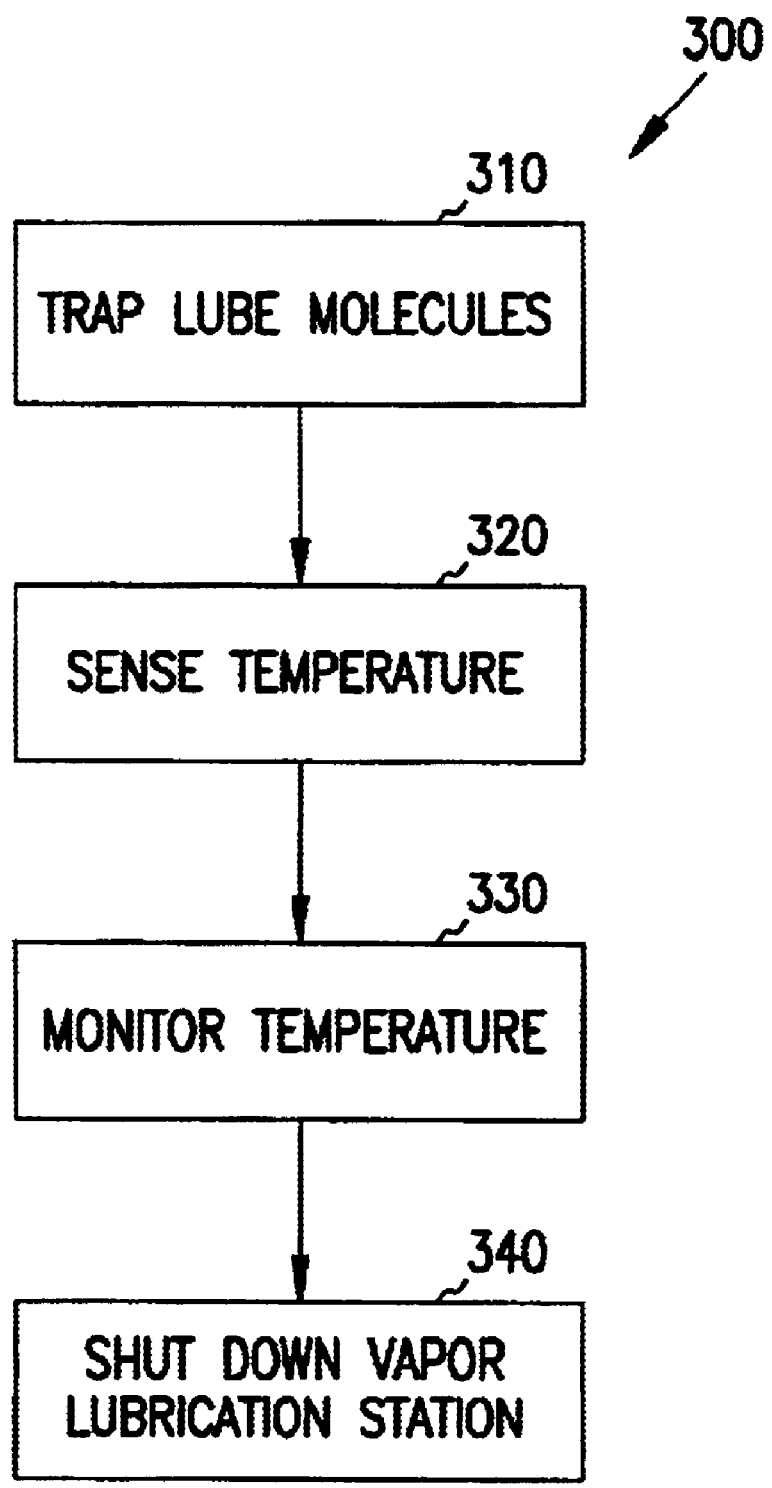
FIG. 3 is a flow diagram of a method of lubricating a storage disc according to the present invention.

FIG. 3 is a flow diagram illustrating a method 300 of preventing migration (cross-contamination) of lubrication molecules into adjacent process chambers during a vapor lubrication process to deposit a thin layer of lubricant over disc surfaces. In this example embodiment shown in FIG. 3, the method 300 begins with the step 310 of trapping lubrication molecules that are not deposited onto the surface of the storage discs during the vapor lubrication process using one or more cold traps including cold trapping surfaces. In some embodiments, the trapping of the lubrication molecules includes trapping the lubrication molecules during transfer of the discs from upstream processes to the vapor lubrication station and/or during transfer of the discs from the vapor lubrication station to downstream processes.

Step 320 includes sensing the temperature of the cold trapping surfaces. In some embodiments, sensing the temperature further includes outputting a signal proportional to the sensed temperature.

Step 330 includes monitoring the sensed temperature. Step 340 includes shutting down the vapor lubrication station to prevent accidental migration of lubrication molecules into the adjacent process chambers based on the outcome of the monitoring. In some embodiments, shutting down the vapor lubrication station includes shutting down the vapor lubrication station due to a failure in the operation of the cold traps.

Figure 4:
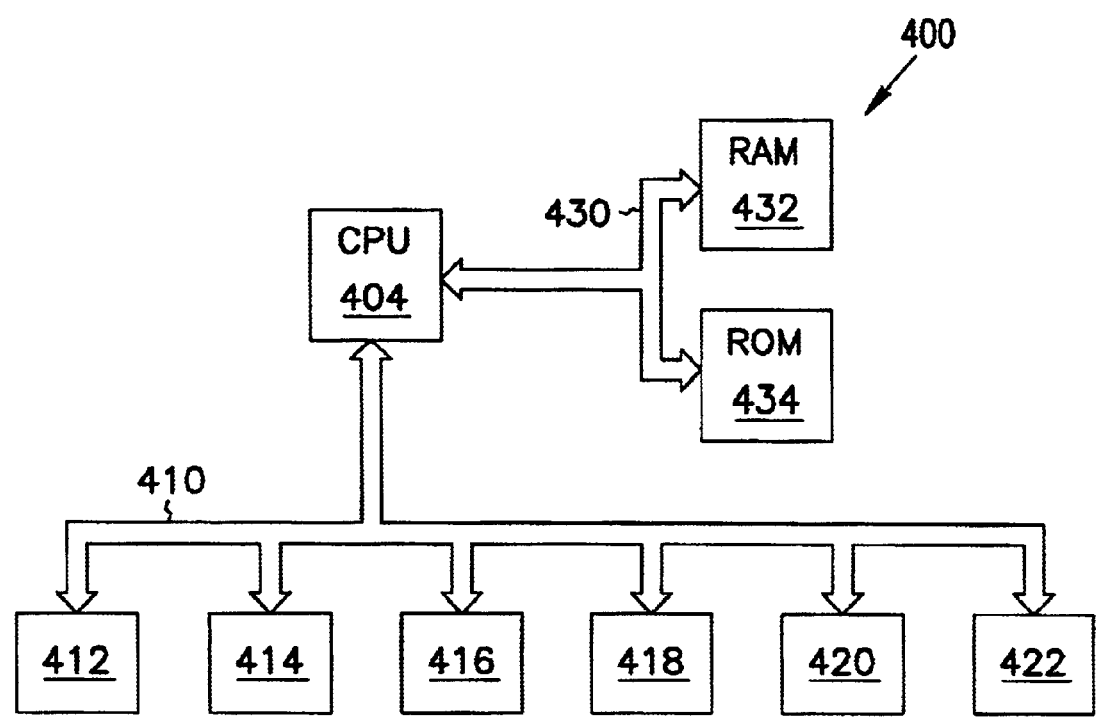
FIG. 4 is a schematic view of a computer system.

FIG. 4 is a schematic view of a computer system. Advantageously, the invention is well suited for use in a computer system 400. The computer system 400 may also be called an electronic system or an information handling system and includes a central processing unit, a memory and a system bus. The information handling system includes a central processing unit 404, a random access memory 432, and a system bus 430 for communicatively coupling the central processing unit 404 and the random access memory 432. The information handling system may also include an input/output bus 410 and several peripheral devices, such as 412, 414, 416, 418, 420, and 422 that may be attached to the input output bus 410. Peripheral devices may include hard disc drives, magneto-optical drives, floppy disc drives, monitors, keyboards and other such peripherals. Any type of disc drive may include a storage disc including a thin layer of lubricant deposited according to the teachings of the present invention.

CONCLUSION

In conclusion, a method 300 is described for preventing migration (cross-contamination) of lubrication molecules into adjacent process chambers during a vapor lubrication process to deposit a thin layer of lubricant over disc surfaces. In this example embodiment shown in FIG. 3, the method 300 begins with the step 310 of trapping lubrication molecules that are not deposited onto the surface of the storage discs during the vapor lubrication process using one or more cold traps, including cold trapping surfaces. In some embodiments, the trapping of the lubrication molecules includes trapping the lubrication molecules during transfer of the discs from upstream processes to the vapor lubrication station and/or during transfer of the discs from the vapor lubrication station to downstream processes.

Step 320 includes sensing the temperature of the cold trapping surfaces. In some embodiments, sensing the temperature further includes outputting a signal proportional to the sensed temperature.

Step 330 includes monitoring the sensed temperature. Step 340 includes shutting down the vapor lubrication station to prevent accidental migration of lubrication molecules into the adjacent process chambers based on the outcome of the monitoring. In some embodiments, shutting down the vapor lubrication station includes shutting down the vapor lubrication station due to a failure in the operation of the cold traps.

Also discussed is a vapor lubrication station 210 that includes one or more cold traps 280 to prevent migration of lubrication molecules that are not deposited onto storage discs 265 during a vapor lubrication process in the vapor lubrication station 210 into adjacent process chambers. Further the cold traps 210 include cold trapping surfaces 282 to trap and prevent migration of lubrication molecules into transport chambers used in transporting the storage discs 265 between the process chambers. Also, the station 210 includes one or more temperature sensors 285 to sense the temperature of the cold trapping surfaces 282 and to output a signal proportional to the temperature. Further, the station 210 includes a control circuitry 290 coupled to the temperature sensors 285 to automatically shut-off the operation of the vapor lubrication station 210 to prevent accidental migration of lubrication molecules in case of a failure in the operation of the cold traps 280.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A vapor lubrication station, comprising:

one or more cold trans to prevent migration of lubrication molecules that are not deposited onto storage discs during a vapor lubrication process from the vapor lubrication station into adjacent process chambers, said adjacent process chambers used to deposit successive layers onto the storage discs to produce discs, and/or transport chambers used in transporting the storage discs between the process chambers.

2. The vapor lubrication station of claim 1, further comprising:

one or more entry/exit ports disposed between the vapor lubrication station and/or the adjacent process chambers, wherein the one or more cold traps are disposed around the one or more entry/exit ports, respectively.

3. The vapor lubrication station of claim 2, wherein the one or more entry exit ports comprise:

gates and/or valves that open and close to receive and output the discs.

4. The vapor lubrication station of claim 1, wherein the vapor lubrication station is held under low working pressure in the range of about $5 \times 10^{-5}$ to $5 \times 10^{-9}$ Torr by means of high performance vacuum pumps.

5. The vapor lubrication station of claim 1, wherein the cold traps comprise:

cold trapping surfaces to prevent migration of lubrication molecules that are not deposited onto the disc into the adjacent process chambers.

6. The vapor lubrication station of claim 5, wherein the cold trapping surfaces are cooled to have a temperature in the range of about $-195°$ C. to $25°$ C. using refrigerants selected from a group consisting of liquid nitrogen, low-temperature refrigerant, and cold water.

7. The vapor lubrication station of claim 5, further comprising:

one or more temperature sensors to sense the temperature of the cold trapping surfaces and to output a signal proportional to the sensed temperature; and a control circuitry coupled to the temperature sensors to monitor the temperature of the cold trapping surfaces by receiving the signal from the temperature sensors, and further to automatically shut-off the operation of the vapor lubrication station to prevent accidental migration of lubrication molecules due to a failure in the operation of the cold traps.

* * * * *